United States Patent [19]
Sumida et al.

[11] Patent Number: 5,674,090
[45] Date of Patent: Oct. 7, 1997

[54] CASING FOR RECEIVING ELECTRICAL CONNECTION BOX

[75] Inventors: Tatsuya Sumida; Shinji Kawakita, both of Yokkaichi, Japan

[73] Assignee: Sumitomo Wiring Systems, Ltd., Yokkaichi, Japan

[21] Appl. No.: 610,883

[22] Filed: Mar. 5, 1996

[30] Foreign Application Priority Data

Mar. 15, 1995 [JP] Japan ................................ 7-056115
Apr. 4, 1995 [JP] Japan ................................ 7-078656

[51] Int. Cl.$^6$ .................................................. H01R 13/66
[52] U.S. Cl. ......................................... 439/540.1; 439/535
[58] Field of Search ............................. 439/540, 540.1, 439/535, 34

[56] References Cited

U.S. PATENT DOCUMENTS 4,954,102  9/1990  Ozaki et al. .
5,415,308  5/1995  Oda .

FOREIGN PATENT DOCUMENTS

4-86028  7/1992  Japan .

Primary Examiner—Khiem Nguyen
Assistant Examiner—Eugene G. Byrd
Attorney, Agent, or Firm—Greenblum & Bernstein, P.L.C.

[57] ABSTRACT

A casing for receiving a plurality of electrical connection boxes, comprising: a casing body for accommodating at least one of the electrical connection boxes in it; a cover for closing an opening of the casing body; and an outer fixing member for fixing the remaining one of the electrical connection boxes to an outside of the casing body, which is provided on the outside of the casing body.

10 Claims, 10 Drawing Sheets

CASING FOR RECEIVING ELECTRICAL CONNECTION BOX

BACKGROUND OF THE INVENTION

The present invention generally relates to a casing for receiving electrical connection boxes such as a junction box, a relay box, a fusible link box, etc., which is mounted on a body of a motor vehicle and more particularly, to reduction of rise of temperature in the casing due to heat produced by the electrical connection boxes accommodated in the casing.

Figure 1:
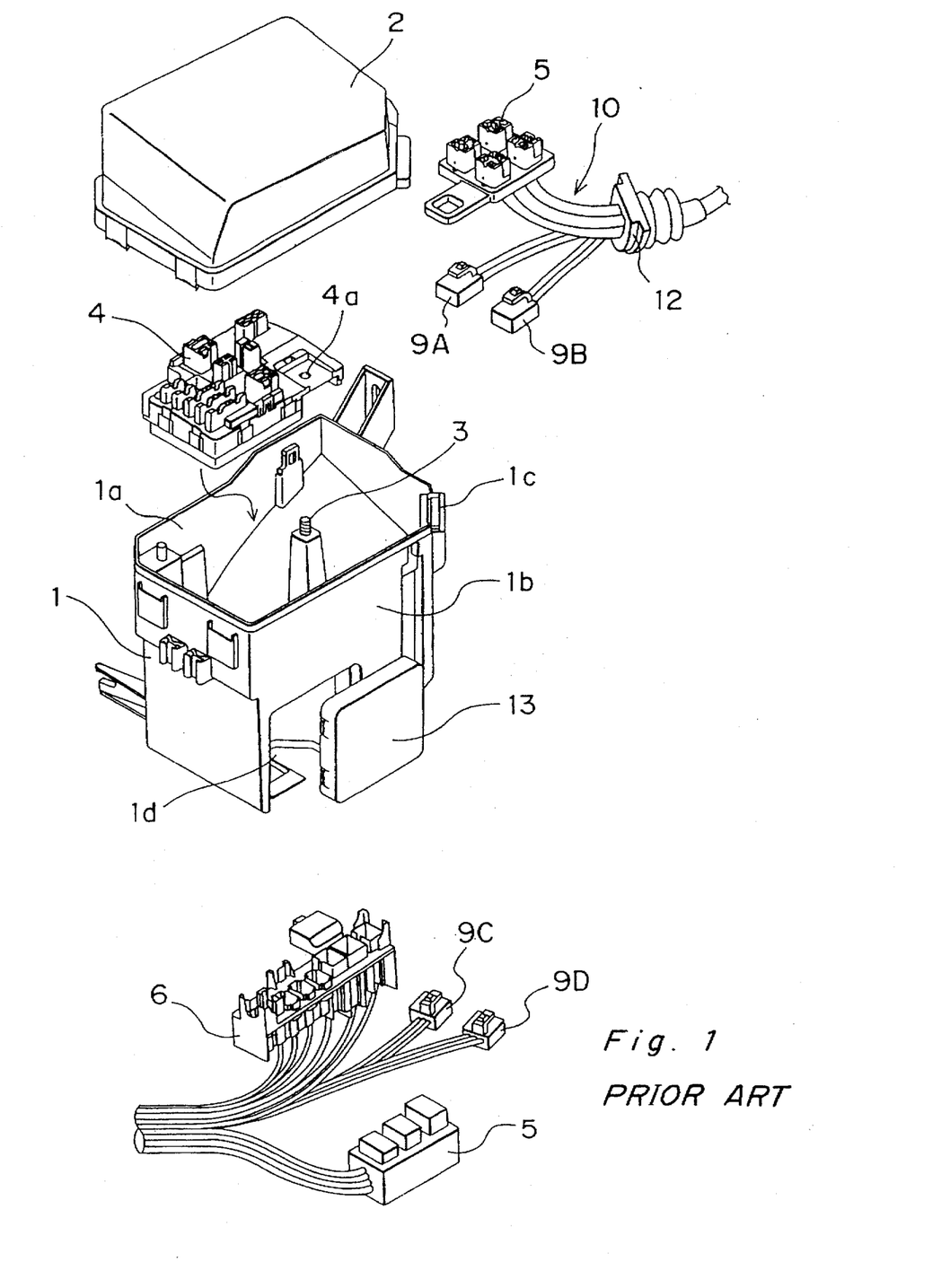
FIG. 1 is an exploded perspective view of a prior art casing for accommodating electrical connection boxes (already referred to)

Conventionally, casings for accommodating electrical connection boxes are known. FIG. 1 shows one example of the known casings. In FIG. 1, a resinous casing body 1 is bolted to a vehicle body (not shown) and an upper opening 1a of the casing body 1 is closed by an upper cover 2. A bolt 3 is projected into the casing body 1. After the bolt 3 has been inserted through a through-hole 4a of a junction box 4, the junction box 4 is secured to the casing body 1 upon threaded engagement of a nut (not shown) with the bolt 3. A relay box 5 and a fusible link box 6 are fixed to the junction box 4 by known locking mechanisms (not shown), respectively.

A recess 1c is formed at a portion of a side wall 1b of the casing body 1 so as to extend up to an upper end of the side wall 1b, while a side opening 1d is formed at a lower end portion of the side wall 1b so as to open to a bottom of the side wall 1b. Connectors 9A and 9B for connecting the relay box 5 to the junction box 4 and connectors 9C and 9D for connecting the fusible link box 6 to the junction box 4 are each provided at a distal end of a plurality of wires 10 and are inserted into the casing body 1 from the recess 1c or the side opening 1d by bundling a plurality of the wires 10.

A packing member (not shown) for hermetically closing the upper opening 1a of the casing body 1 is attached to a lower end portion of the upper cover 2 so as to prevent entry of water into the casing body 1. A grommet 12 is fitted around the wires 10 drawn out of the recess 1c so as to prevent entry of water into the casing body 1 from the recess 1c. Meanwhile, a side cover 13 for closing the side opening 1d is mounted on the side wall 1b so as to prevent entry of water into the casing body 1 from the side opening 1d.

However, in the above mentioned known casing, such a problem arises that since the casing is sealed to some extent for waterproofing, temperature in the casing rises by heat produced by circuits of the electrical connection boxes upon energization of the circuits. In order to reduce rise of temperature in the casing, the number of the circuits of the electrical connection boxes accommodated in the casing should be lessened or some of the electrical connection boxes should be provided at other locations than the casing without being accommodated in the casing.

Meanwhile, since a number of the electrical connection boxes are accommodated in the known casing referred to above, diameters of bundles of the wires 10 are large. Therefore, working efficiency for accommodating the junction box 4, the relay box 5 and the fusible link box 6 in the casing body 1 is not high. Especially, since the fusible relay box 6 is provided at the distal end of the wires 10 having large diameter in general, working efficiency for accommodating the fusible link box 5 in the casing body 1 is low.

Figure 2:
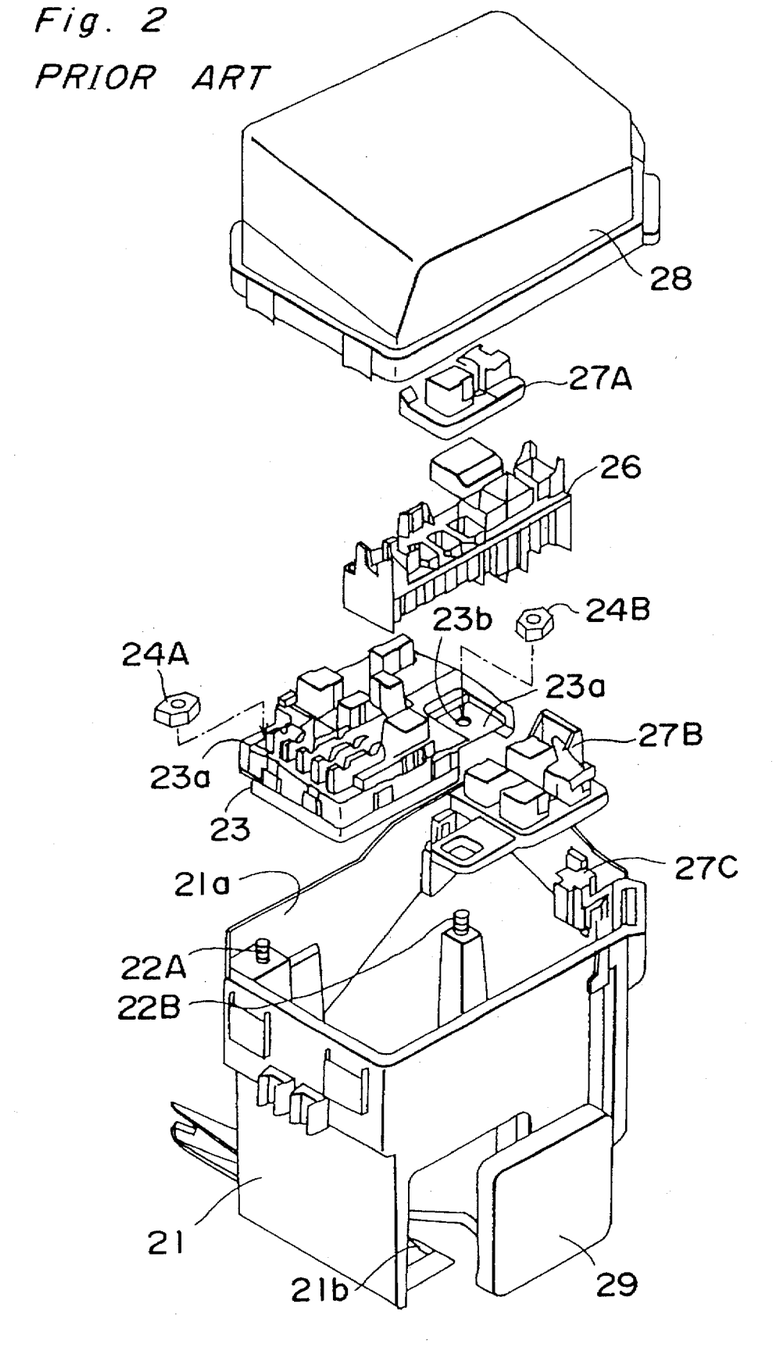
FIG. 2 is an exploded perspective view of a prior art construction for fixing electrical connection boxes to a casing (already referred to)

Furthermore, the present invention is also directed to a construction for fixing the electrical connection boxes to the casing. FIG. 2 shows one example of known constructions for fixing the electrical connection boxes to a resinous casing body 21 bolted to a vehicle body (not shown) preliminarily in an engine room or the like. Bolts 22A and 22B are projected into the casing body 21 and are, respectively, inserted through through-holes 23b formed at mounting portions 23a of a junction box 23. Then, the junction box 23 is mechanically fixed to the casing body 21 securely upon threaded engagement of nuts 24A and 24B with the bolts 22A and 22B, respectively such that electrical failures of the junction box 23 is prevented. A fusible link box 26 and relay boxes 27A, 27B and 27C are secured to the junction box 23 by known locking mechanisms, respectively. An upper cover 28 and a side cover 29 close an upper opening 21a and a side opening 21b of the casing body 21, respectively so as to seal the casing body 21 such that waterproofing function is imparted to the casing body 21.

Meanwhile, when the junction box is secured to the vehicle body as described above with the bolts and the nuts, tools such as impact wrenches for fastening the bolts and the nuts are required to be used and thus, operation of fastening the bolts and nuts is troublesome. Meanwhile, when the junction box is secured to the vehicle body, cost for the bolts and the nuts and cost for fastening the bolts to the casing are incurred, thereby resulting in rise of production cost of the motor vehicle.

Furthermore, in case the above mentioned known construction for fixing the electrical connection boxes to the casing is employed, the mounting portions 23a having the through-holes 23b are required to be provided in the junction box 23 and thus, such an inconvenience is encountered that area for laying bus bars (not shown) in the junction box 3 and the number of components to be mounted on the junction box 3 are restricted.

SUMMARY OF THE INVENTION

Accordingly, a first object of the present invention is to provide, with a view to eliminating the above mentioned disadvantages of prior art casings, a casing for receiving electrical connection boxes, in which rise of temperature due to heat produced by the electrical connection boxes accommodated in the casing is reduced and working efficiency for accommodating the electrical connection boxes in the casing is raised.

A second object of the present invention is to provide a construction for fixing the electrical connection boxes to the casing, in which the electrical connection boxes can be secured to a vehicle body without using tools and restrictions on degrees of freedom of configurations of circuits in the electrical connection boxes and the number of components to be mounted on the electrical connection boxes are lightened.

In order to accomplish the first object of the present invention, a casing for receiving a plurality of electrical connection boxes, according to a first embodiment of the present invention comprises: a casing body for accommodating at least one of the electrical connection boxes therein; a cover for closing an opening of the casing body; and an outer fixing member for fixing the remaining one of the electrical connection boxes to an outside of the casing body which is provided on the outside of the casing body.

Meanwhile, in order to accomplish the second object of the present invention, a construction for fixing an electrical connection box in a casing body of a casing, according to a second embodiment of the present invention comprises: a plurality of locking members which are provided on side faces of a housing of the electrical connection box, respectively and each of which includes a locking piece and a guide portion having a guide groove; and a plurality of protrusions which are, respectively, provided on inner faces of side walls of the casing body so as to be each inserted into the guide groove and each of which includes a locking groove engageable with the locking piece; wherein one of the locking members acts as a reference locking member such that the guide portion of the reference locking member is projected further towards the casing body than those of the remaining ones of the locking members.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 3:
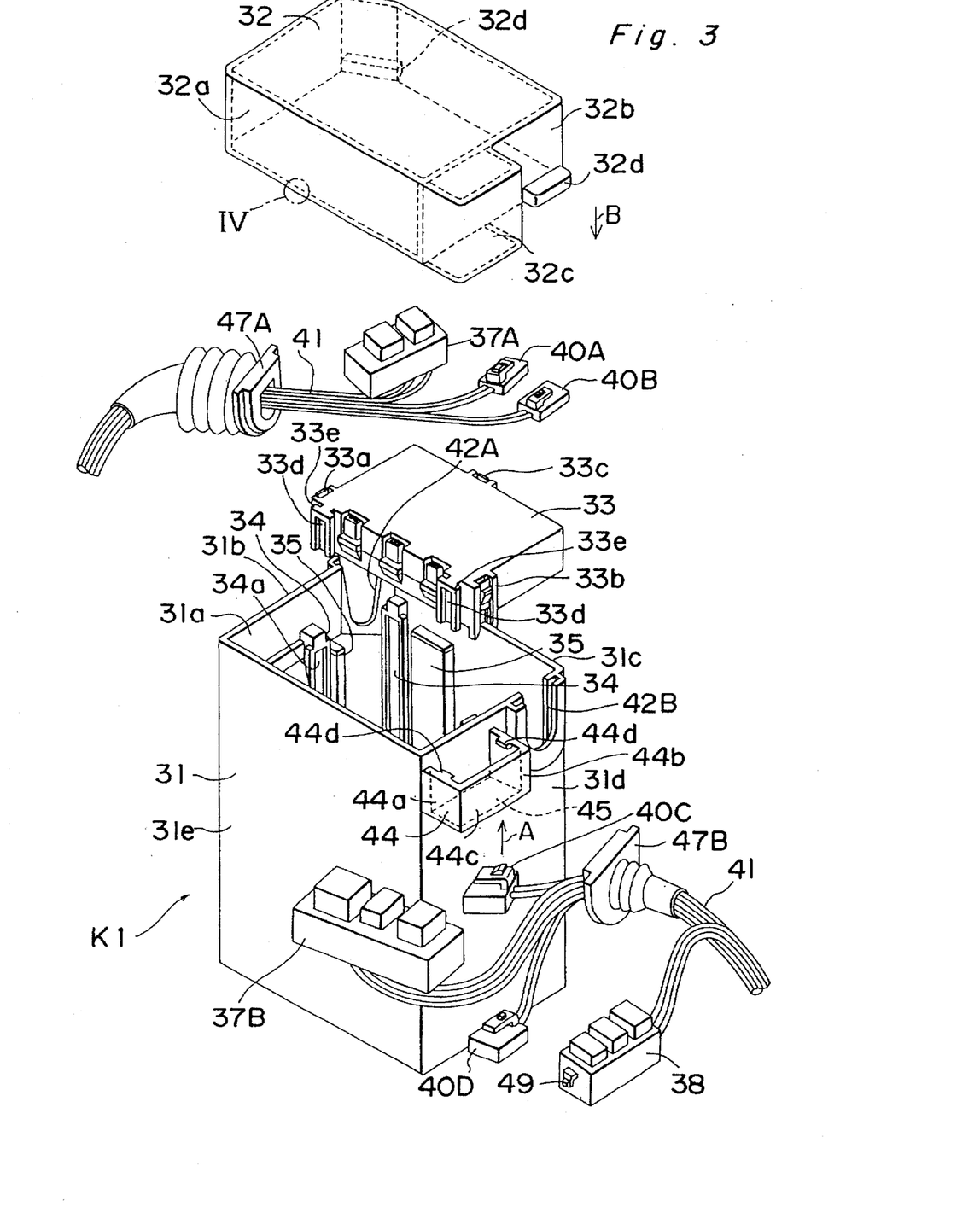
FIG. 3 is an exploded perspective view of a casing for receiving electrical connection boxes, according to a first embodiment of the present invention.
Figure 4:
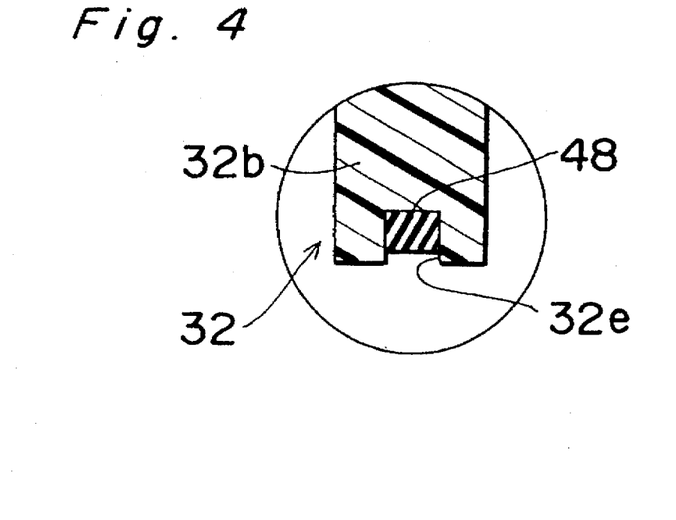
FIG. 4 is an enlarged view of a portion IV in FIG. 3.
Figure 5:
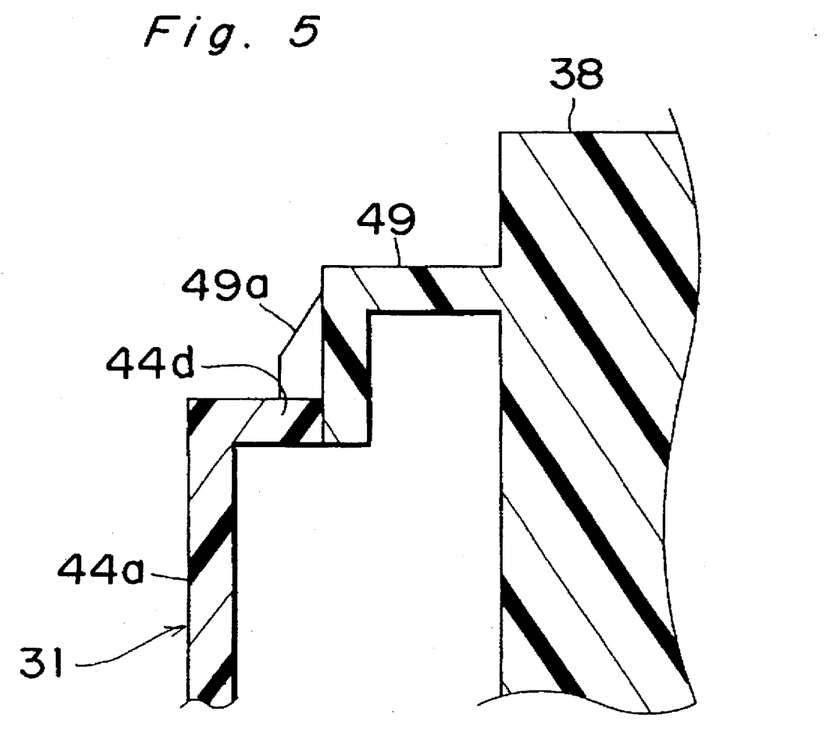
FIG. 5 is a fragmentary sectional view of a fusible link box mounted on the casing of FIG. 3.

Referring now to the drawings, there is shown in FIGS. 3 to 5, a rectangular casing K1 for receiving electrical connection boxes, according to a first embodiment of the present invention. As shown in FIG. 3, the casing K1 includes a casing body 31 having an upper opening 31a and a cover 32 for closing the upper opening 31a. In this embodiment, both the casing body 31 and the cover 32 are made of resin. The electrical connection boxes accommodated in the casing body 31 include a junction box 33, relay boxes 37A and 37B and a fusible link box 38. Furthermore, connectors 40A, 40B, 40C and 40D are accommodated in the casing K1. The junction box 33, the relay boxes 37A and 37B, the fusible link box 38 and the connectors 40A to 40D which are accommodated in the casing body 31 are provided at distal ends of wires 41.

The casing body 31 has four side walls 31b, 31c, 31d and 31e, while locking bosses 33a, 33b and 33c are provided on the junction box 33. Three projections 34 each having a locking groove 34a for its engagement with each of the locking bosses 33a to 33c are provided on inner faces of the side walls 31b, 31c and 31d, respectively. A support 35 for supporting the junction box 33 from below is provided in the vicinity of each of the projections 34.

Likewise, two projections 33e each having a locking groove 33d for its engagement with a locking boss (not shown) formed on each of the relay boxes 37A and 37B are provided on side faces of the junction box 33. Holes 42A and 42B for drawing the wires 41 out of the casing body 31 are formed on the side walls 31c and 31d.

A substantially U-shaped frame 44 is provided on an outer face of the side wall 31d of the casing body 31 so as to act as an outer fixing member for fixing the fusible link box 38 thereto. The frame 44 includes opposite side plates 44a and 44b extending substantially perpendicularly to the outer face of the side wall 31d and an outer plate 44c for coupling distal ends of the side plates 44a and 44b. A mounting through-hole 45 is defined by the side wall 31d of the casing body 31, the side plates 44a and 44b and the outer plate 44c. A rectangular engageable plate 44d projecting into the mounting through-hole 45 is provided at an upper end portion of each of the side plates 44a and 44b.

The cover 32 is formed by a downwardly opening rectangular box and includes a closing portion 32a for closing the upper opening 31a of the casing body 31. A downwardly opening rectangular protective portion 32c for covering an upper portion of the fusible link box 38 mounted on the frame 44 of the casing body 1 is provided on a side wall 32b of the closing portion 32a. The closing portion 32a is further provided with a pair of housing portions 32d for receiving upper portions of grommets 47A and 47B, respectively.

Furthermore, as shown in FIG. 4, a slot 32e is formed on a lower end of the side wall 32b of the closing portion 32a of the cover 32 so as to receive a packing member 48 made of elastic material. When the upper opening 31a of the casing body 31 has been closed by the cover 32, an upper end of the side walls 31b to 31e is fitted into the slot 32e so as to be brought into close contact with the packing member 48. Meanwhile, the cover 32 is secured to the upper opening 31a of the casing body 31 by a locking mechanism (not shown).

When the junction box 33, the relay boxes 37A and 37B and the fusible link box 38 are accommodated in the casing K1 and are fixed to the casing K1, the junction box 33 is initially inserted into the casing body 31 from the upper opening 31a and the locking bosses 33a to 33c of the junction box 33 are brought into engagement with the locking grooves 34a of the projections 34 of the casing body 31, respectively such that the junction box 33 is secured in the casing body 31. Subsequently, the relay boxes 37A and 37B, the fusible link box 38 and connectors 40A to 40D are accommodated in the casing body 31. Meanwhile, in this embodiment, the wires 41 having the relay box 37A and the connectors 40A and 40B at their distal ends are bundled so as to be inserted through the grommet 47A, while the wires 41 having the relay box 37B, the fusible relay box 38 and the connectors 40C and 40D at their distal ends are bundled so as to be inserted through the grommet 47B.

After the grommet 47A has been attached to the hole 42A of the casing body 31, the wires 41 for the relay box 37A and the connectors 40A and 40B are drawn into the casing body 31 so as to displace the relay box 37A and the connectors 40A and 40B into the casing body 31. Then, the relay box 37A is secured to the junction box 33 and the connectors 40A and 40B are coupled with the junction box 33.

On the other hand, after the grommet 47B has been attached to the hole 42B of the casing body 31, the wires 41 for the relay box 37B and the connectors 40C and 40D are drawn into the casing body 31 so as to displace the relay box 37B and the connectors 40C and 40D into the casing body 31. Then, the relay box 37B is secured to the junction box 33 and the connectors 40C and 40D are coupled with the junction box 33. Meanwhile, the fusible link box 38 is inserted into the mounting through-hole 45 of the frame 44 of the casing body 31 from below in the direction of the arrow A in FIG. 3 and then, a locking boss 49a disposed at a distal end of each of a pair of locking arms 49 which are provided at opposite ends of the fusible link box 38, respectively is brought into engagement with each of the engageable plates 44d of the frame 44 of the casing body 31 such that the fusible link box 38 is secured to the frame 44.

In this embodiment, since the fusible link box 38 is secured to outside of the casing body 31 as described above, the wires 41 having the fusible link box 38 at their distal ends are not required to be drawn into the casing body 31. Since the wires 41 having the fusible link box 38 at their distal ends are larger in diameter than the wires 41 having the relay boxes 37A and 37B or the connectors 40A to 40D at their distal ends and therefore, are difficult to handle, working efficiency for accommodating the fusible link box 38 in the casing body 31 is raised by eliminating the need for drawing the wires 41 for the fusible link box 38 into the casing body 31. Meanwhile, since the wires 41 for the fusible link box 38 are not required to be drawn into the casing body 31, the number of the wires 41 to be drawn into the casing body 31 decreases accordingly, thereby resulting in rise of working efficiency for accommodating the electrical connection boxes in the casing body 31.

Thereafter, the cover 32 is displaced towards the upper opening 31a of the casing body 31 and is mounted on the casing body 31 by the locking mechanism (not shown). In this state, the upper end of the side walls 31b to 31e of the casing body 31 is brought into close contact with the packing member 48, while the upper portions of the grommets 47A and 47B are received in the housing portions 32d of the cover 32, respectively. Furthermore, the holes 42A and 42B of the casing body 31 are, respectively, sealed by the grommets 47A and 47B. Thus, in this embodiment, the casing body 31 closed by the cover 32 is sealed to some extent by the packing member 48 and the grommets 47A and 47B. Meanwhile, when the cover 32 has been mounted on the casing body 31 as described above, the protective portion 32c of the cover 31 covers the upper portion of the fusible link box 38 mounted on the frame 44 of the casing body 31.

Thus, in this embodiment, the fusible link box 38 which produces larger quantity of heat than the junction box 33 and the relay boxes 37A and 37B is attached to outside of the casing body 31. Therefore, although the casing body 31 is sealed to some extent by the packing member 48 and the grommets 47A and 47B, heat produced by circuits of the fusible link box 38 upon energization of the circuits is not confined in the casing body 31, so that rise of temperature in the casing body 31 is prevented.

In the casing K1, since the upper portion of the fusible link box 38 mounted on outside of the casing body 31 is covered by the protective portion 32c of the cover 32, it is possible to prevent dust or water from penetrating into the fusible link box 38 from above. Meanwhile, the present invention is not restricted to the above mentioned first embodiment but can be modified variously. For example, in the same manner as a prior art casing shown in FIG. 1, the junction box and the relay boxes accommodated in the casing body may also be fixed to the casing body by bolts and nuts. Furthermore, in this embodiment, the single outer fixing member for fixing the fusible link box to the casing body is provided but two or more outer fixing members may also be provided.

In the casing K1 of the present invention, the following effects can be gained. Since the outer fixing member for fixing the electrical connection box to the casing body is provided on outside of the casing body, rise of temperature in the casing body due to heat produced the circuits of the electrical connection boxes is reduced in comparison with an arrangement in which all the electrical connection boxes are accommodated in the casing body. Meanwhile, since the electrical connection box fixed to the outer fixing member is not required to be accommodated in the casing body, the wires having this electrical connection box at their distal ends are not required to be drawn into the casing body and thus, working efficiency for accommodating the electrical connection boxes in the casing body 31 is raised.

Meanwhile, when the electrical connection box is inserted into the through-hole of the outer fixing member of the casing body, the locking arm means provided on the electrical connection box is brought into engagement with the engageable plate means of the outer fixing member. As a result, the electrical connection box can be fixed to the outer fixing member positively.

Furthermore, since the cover is provided with the protective portion for covering the upper portion of the electrical connection box fixed to the outer fixing member, it is possible to prevent entry of dust or water into the electrical connection box fixed to the outer fixing member.

The circuits of the fusible link box generally produce larger quantity of heat than those of other kinds of the electrical connection boxes such as the junction box and the relay box. Therefore, in case the electrical connection box fixed to the outer fixing member is the fusible link box, rise of temperature in the casing body can be reduced effectively. Moreover, since diameter of the wires for the fusible link box is larger than those of other kinds of the electrical connection boxes such as the junction box and the relay box, working efficiency for accommodating the electrical connection boxes in the casing body is improved greatly.

FIGS. 6 to 15 show a casing K2 for receiving electrical connection boxes, according to a second embodiment of the present invention. The second embodiment is characterized by a construction for fixing the electrical connection boxes to the casing K2. The casing K2 includes a casing body 61 which is of a rectangular boxlike shape having a bottom. The casing body 61 is bolted to a vehicle body preliminarily. An upper opening 61a of the casing body 61 is closed by an upper cover (not shown) such that the casing body 61 is sealed. A junction box 62 and a relay box 63 are accommodated in the casing body 61. Wire lead-out portions 61b and 61c for drawing out of the casing body 61 wires (not shown) connected to the junction box 62 and the relay box 63, respectively are provided on the casing body 61.

Figure 6:
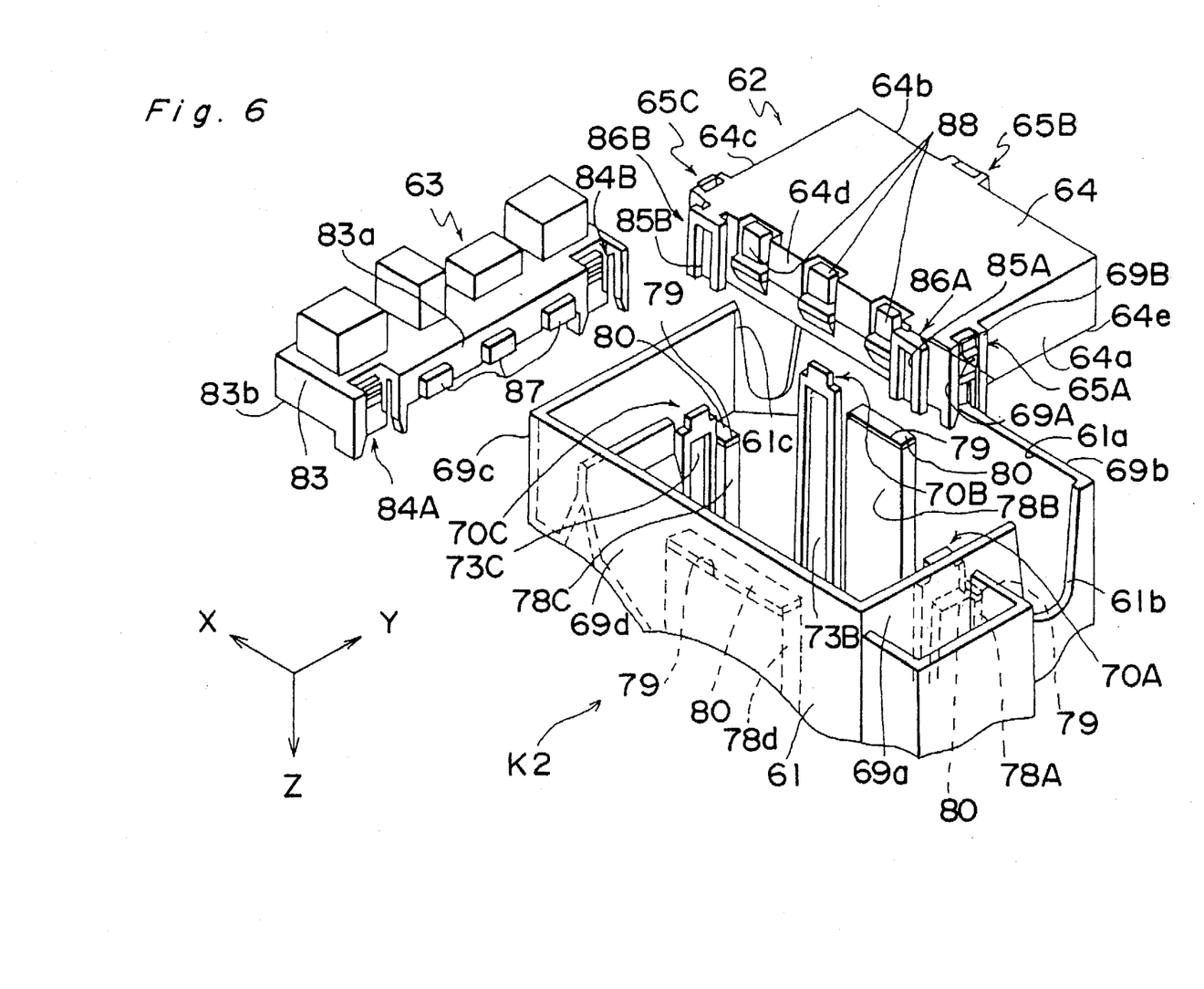
FIG. 6 is a fragmentary perspective view of a casing according to a second embodiment of the present invention.
Figure 7:
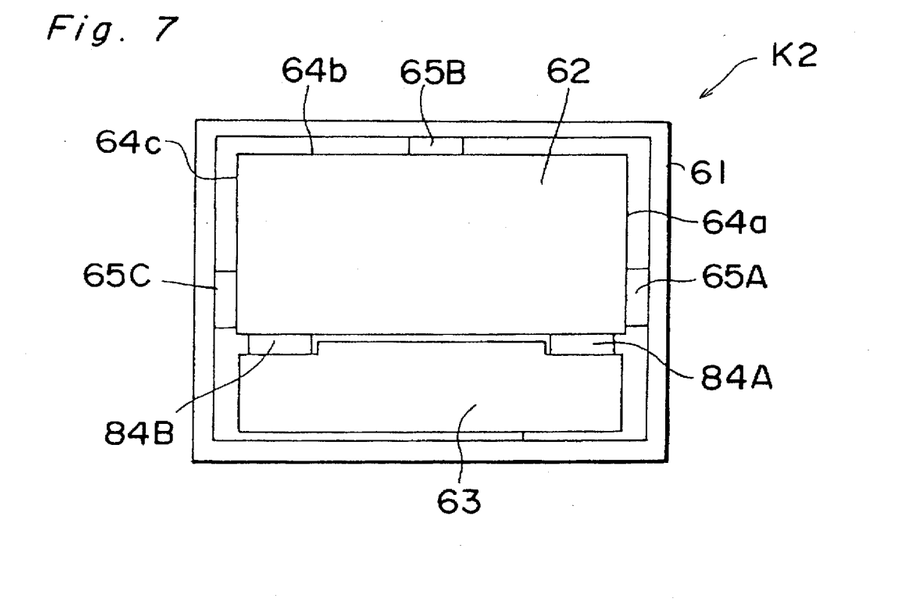
FIG. 7 is a schematic top plan view of the casing of FIG. 6.

The junction box 62 includes a housing 64 having four side faces 64a, 64b, 64c and 64d. Locking members 65A, 65B and 65C for fixing the junction box 62 to the casing K2 are, respectively, provided on the side faces 64a, 64b and 64c. Among the locking members 65A to 65C in this embodiment, the locking member 65A acts as a reference locking member and the remaining locking members 65B and 65C act as ordinary locking members. As will be described later, the reference locking member 65A is used for positioning the junction box 62 in a longitudinal direction X and a lateral direction Y, which are orthogonal to a vertical direction Z for mounting the junction box 63 on the casing body 61 as shown in FIG. 6.

Figure 8:
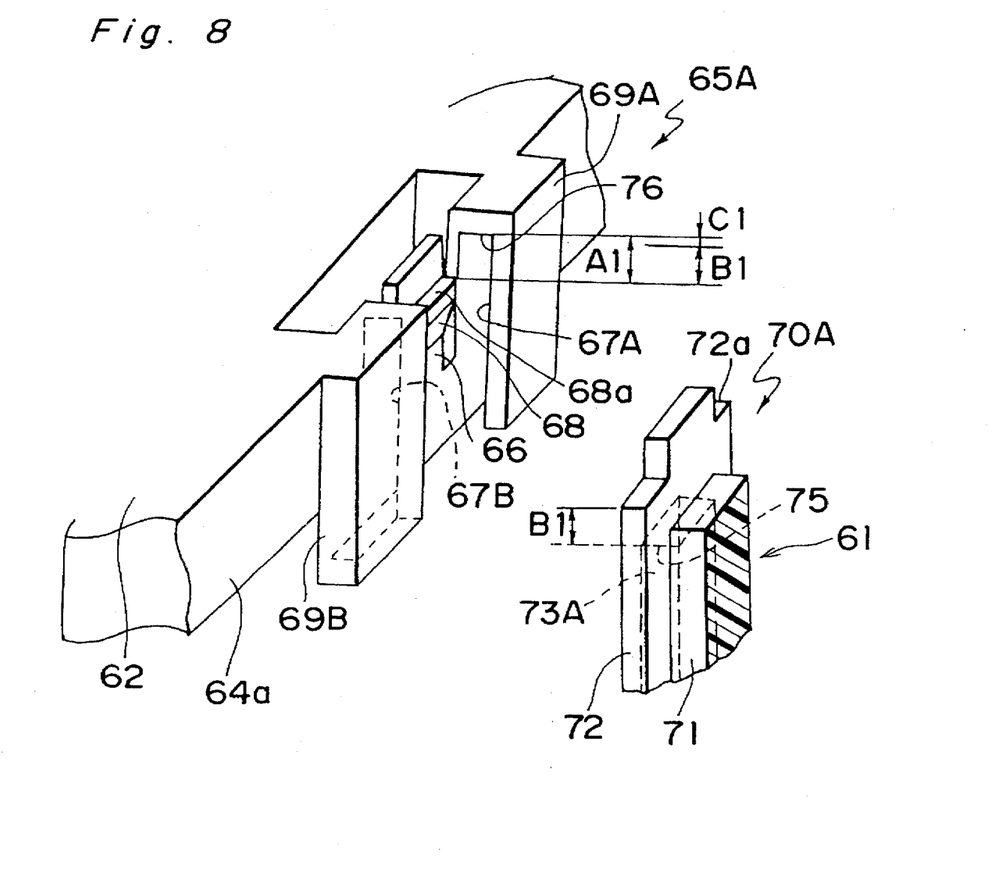
FIG. 8 is an exploded perspective view of a reference locking member employed in the casing of FIG. 6.
Figure 9:
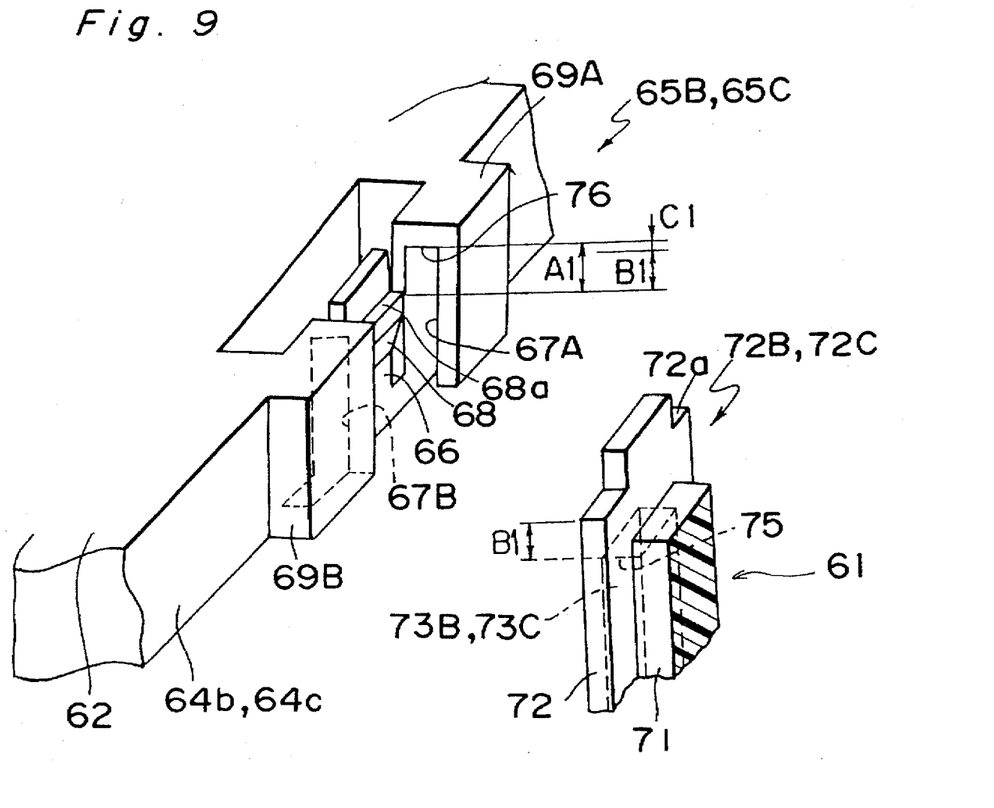
FIG. 9 is an exploded perspective view of an ordinary locking member employed in the casing of FIG. 6.

The locking members 65A to 65C are of known construction and each include a locking piece 66 projecting upwardly like a cantilever. Guide grooves 67A and 67B are, respectively, formed on guide portions 69A and 69B which are provided at opposite sides of the locking piece 66. A locking projection 68 is provided at a distal end of the locking piece 66.

Figure 10:
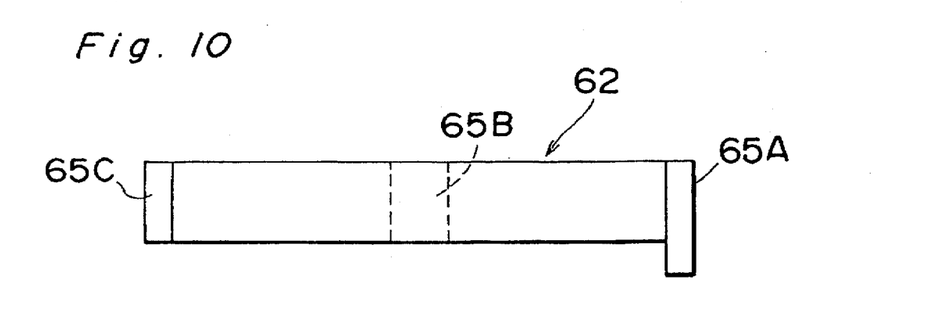
FIG. 10 ia a schematic side elevational view of a junction box accommodated in the casing of FIG. 6.

Meanwhile, as shown in FIG. 10, the guide portions 69A and 69B of the reference locking member 65A are made longer than those of the ordinary locking members 65B and 65C so as to extend further downwardly towards the casing body 61 than those of the ordinary locking members 65B and 65C. As described below, protrusions 70A, 70B and 70C are provided on the casing body 61 so as to be operatively associated with the locking members 65A, 65B and 65C, respectively and each include a head portion 72. By setting length of the guide portions 69A and 69B of the locking members 65A to 65C as described above, the head portion 72 of the protrusion 70A is adapted to be inserted into the guide grooves 67A and 67B of the reference locking member 65A earlier than those of the ordinary locking members 65B and 65C.

On the other hand, the casing body 61 has four side walls 69a, 69b, 69c and 69d. The protrusions 70A, 70B and 70C are provided at locations corresponding to the locking members 65A, 65B and 65C of the junction box 62 on an inner face of the side walls 69a, 69b and 69c, respectively so as to extend vertically. Each of the protrusions 70A to 70C has a substantially T-shaped sectional shape when observed from above and includes a neck portion 71 projecting from each of the side walls 69a, 69b and 69c and the head portion 72 extending upwardly and laterally outwardly in opposite directions from a front face of the neck portion 71. Locking grooves 73A, 73B and 73C which are closed at their upper ends 75 are formed on the head portions 72 of the protrusions 70A, 70B and 70C, respectively.

Figure 11:
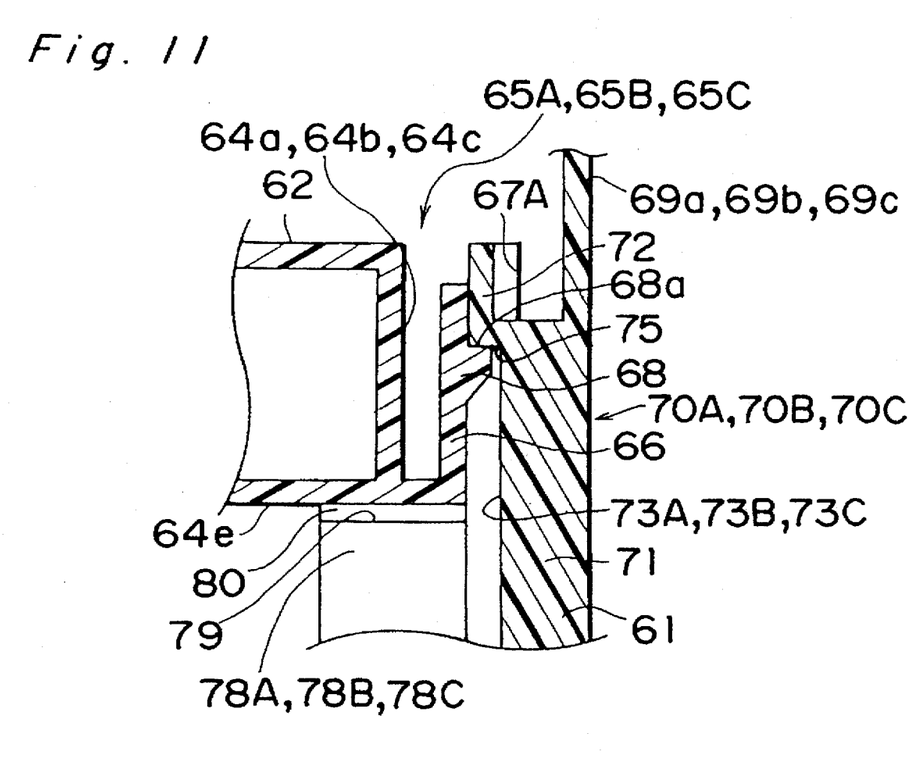
FIG. 11 is a fragmentary sectional view of the locking members of FIGS. 8 and 9.

The locking members 65A to 65C of the junction box 62 are, respectively, brought into engagement with the protrusions 70A to 70C of the casing body 61 as shown in FIG. 11. Namely, when the head portion 72 of each of the protrusions 70A to 70C of the casing body 61 is inserted into the guide grooves 67A and 67B of each of the locking members 65A to 65C of the junction box 62, the locking piece 66 of each of the locking grooves 65A to 65C is elastically deflected rearwards by the head portion 72. Thus, the locking projection 68 of the locking piece 66 is rebounded into each of the locking grooves 73A to 73C such that an upper face 68a of the locking projection 68 and the upper end 75 of each of the locking grooves 73A to 73C are brought into engagement with each other, while an upper end 72a of the head portion 72 is brought into contact with an upper end 76 of each of the guide grooves 67A and 67B. As a result, since the locking members 65A to 65C of the junction box 62 are, respectively, brought into engagement with the protrusions 70A to 70C of the casing body 61, the junction box 62 is locked to the casing body 61.

As shown in FIGS. 8 and 9, a distance A1 between the upper face 68a of the locking projection 68 and the upper end 76 of each of the guide grooves 67A and 67B is set to be larger than a distance B1 between the upper end 75 of each of the locking grooves 73A to 73C and the upper end 72a of the head portion 72 by a distance C1.

Figure 12:
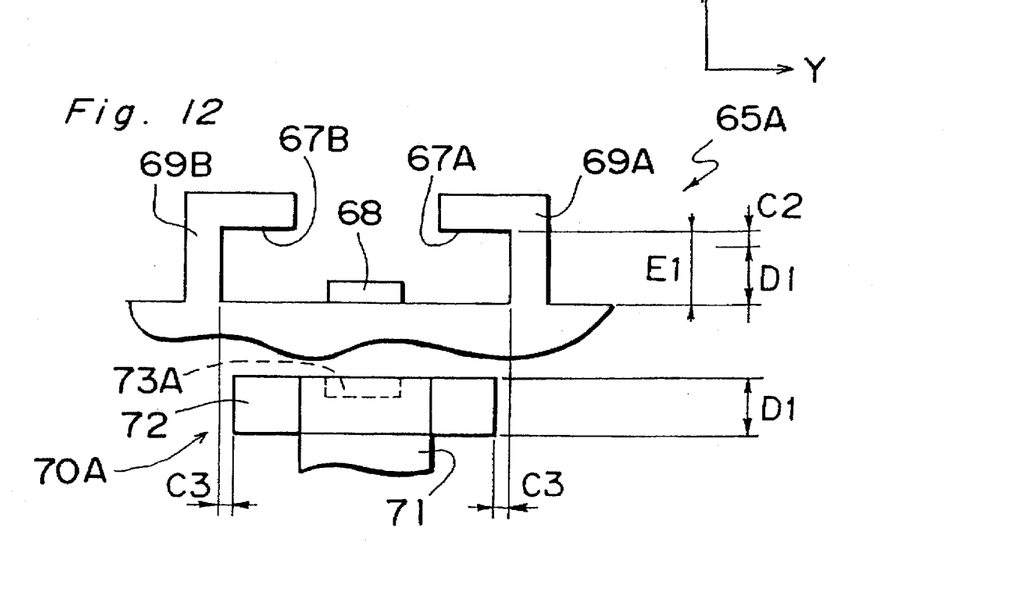
FIG. 12 is a top plan view showing longitudinal and lateral clearances of the reference locking member of FIG. 8.

Meanwhile, in the reference locking member 65A shown in FIG. 12, a width E1 of the guide grooves 67A and 67B is set to be larger than a thickness D1 of the head portion 72 of the protrusion 70A by a distance C2. Like-wise, in the ordinary locking members 65B and 65C shown in FIG. 13, a width E1' of the guide grooves 67A and 67B is set to be larger than a thickness D1' of the head portion 72 of each of the protrusions 70B and 70C by a distance C2'. In the reference locking member 65A, the distance C2 in the longitudinal direction X is minimized in view of dimensional errors of the reference locking member 65A and the protrusion 70A, etc. so as to be smaller than the distance C2' of the ordinary locking members 65B and 65C, namely, C2<C2'.

Figure 13:
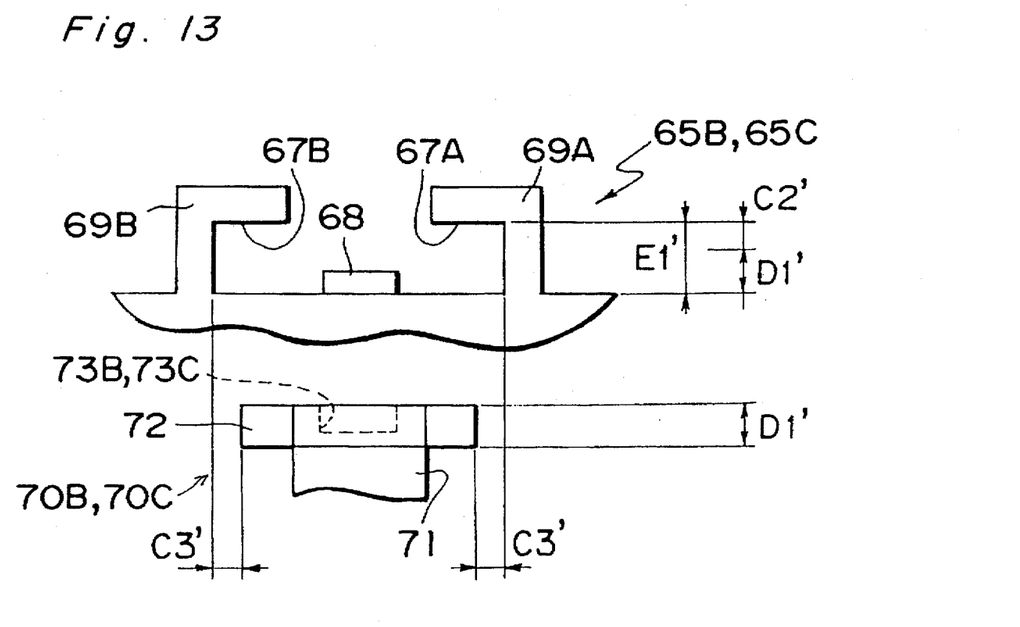
FIG. 13 is a top plan view showing longitudinal and lateral clearances of the ordinary locking member of FIG. 9.

Furthermore, as shown in FIG. 12, a clearance C3 in the lateral direction Y is provided between each of opposite side faces of the head portion 72 of the protrusion 70A for the reference locking member 65A and an inner side face of each of the guide grooves 67A and 67B of the reference locking member 65A. Similarly, as shown in FIG. 13, a clearance C3' is provided between each of opposite side faces of the head portion 72 of each of the protrusions 70B and 70C for the ordinary locking members 65B and 65C and an inner side face of each of the guide grooves 67A and 67B of each of the ordinary locking members 65B and 65C. The clearance C3 of the reference locking member 65A is minimized in view of dimensional errors of the reference locking member 65A and the protrusion 70A so as to be smaller than the clearance C3 of the ordinary locking members 65B and 65C, namely, C3<C3'.

In the junction box 63, vertically extending base portions 78A, 78B and 78C are, respectively, provided adjacent to and below the protrusions 70A, 70B and 70C as shown in FIG. 11. An elastic member 80 is bonded to a flat upper face 79 of each of the base portions 78A to 78C such that a bottom face of the junction box 62 fixed in the casing body 61 is supported by the upper face 79 of each of the base portions 78A to 78C through the elastic member 80 upon engagement of the locking members 65A to 65C with the locking grooves 73A to 73C.

Figure 14:
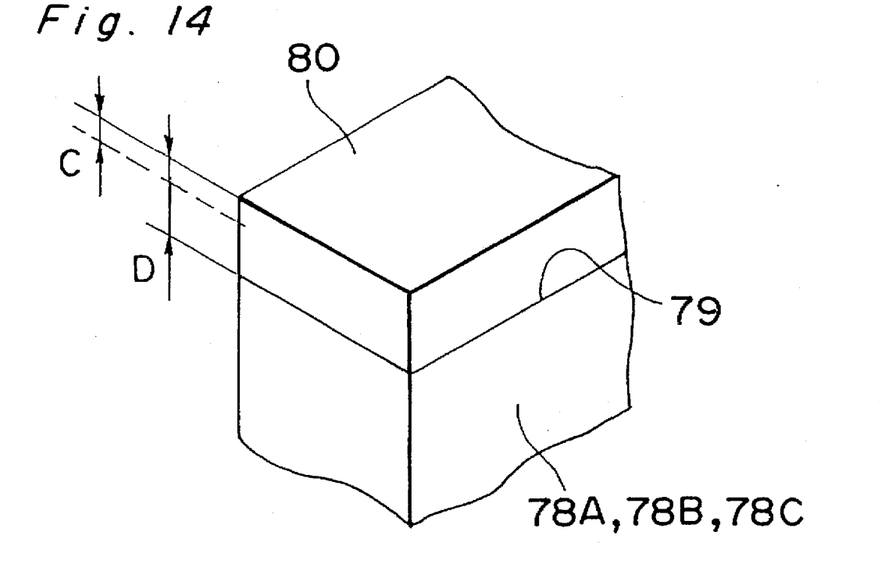
FIG. 14 is a fragmentary perspective view of an elastic member employed in the casing of FIG. 6.

The elastic member 80 is formed by a rubber sheet having a uniform thickness. As shown in FIG. 14, a thickness D of the elastic member 80 is set so as to absorb a vertical clearance C between each of the locking members 65A to 65C and each of the locking grooves 73A to 73C. Namely, the thickness D of the elastic member 80 is set not only to be larger than the vertical clearance C but such that compression set of the elastic member 80 is not produced even if the elastic member 80 is vertically compressed through a distance of the vertical clearance C.

Figure 15:
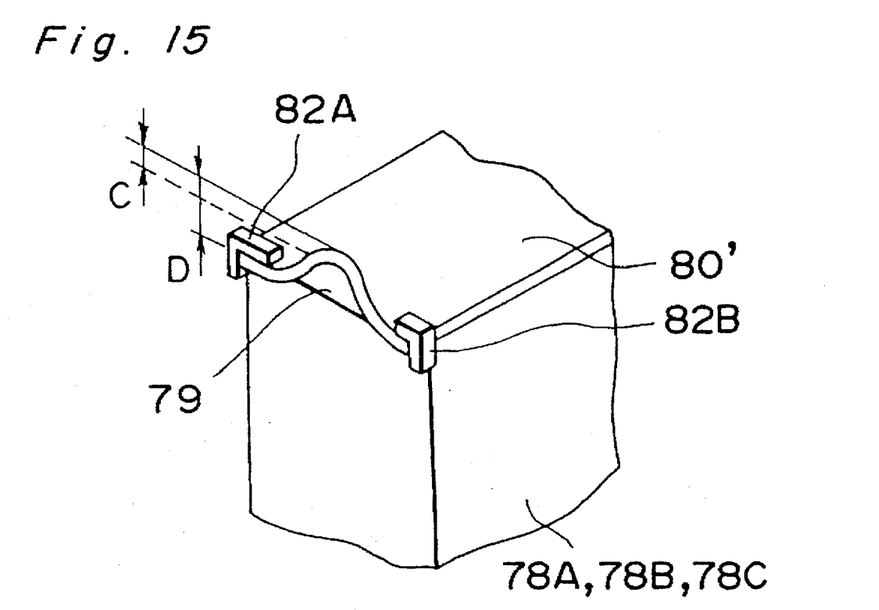
FIG. 15 is a fragmentary perspective view showing another example of the elastic member of FIG. 14.

Meanwhile, material of the elastic member 80 is not restricted to rubber but may also be sponge. As shown in FIG. 15, the elastic member 80 may be replaced by an upwardly convex elastic member 80' which is formed by a leaf spring made of metal or resin. Also in this case, a thickness S of the elastic member 80' may be set not only to be larger than a vertical clearance C between each of the locking members 65A to 65C and each of the locking grooves 73A to 73C but such that compression set of the elastic member 80' is not produced even if the elastic member 80' is vertically compressed through a distance of the vertical clearance C. In case the elastic member 80' formed by the leaf spring is employed, L-shaped engageable pieces 82A and 82B are, respectively, brought into engagement with opposite sides of the elastic member 80' so as to secure the elastic member 80' to each of the base portions 78A to 78C.

The relay box 63 includes a housing 83. Locking members 84A and 84B for mounting the relay box 63 on the junction box 62 are provided on a side face 83 of the housing 83. Meanwhile, protrusions 86A and 86B having locking grooves 85A and 85B are provided at locations corresponding to the locking members 84A and 84B of the relay box 63 on the side face 64d of the housing 64 of the junction box 62, respectively. Constructions of the locking members 84A and 84B of the relay box 63 and the protrusions 86A and 86B of the junction box 62 are similar to those of the locking members 65A to 65C of the junction box 62 and the protrusions 70A to 70C of the casing body 61, respectively. In FIG. 6, the junction box 62 and the relay box 63 are electrically connected to each other by connection members 87 and 88 provided on the relay box 63 and the junction box 62, respectively. Meanwhile, a base portion 78D for supporting the relay box 63 is provided on an inner face of the side wall 69d of the casing body 61 and the elastic member 80 is bonded to the upper face 79 of the base portion 78D.

In this embodiment, when the junction box 62 is fixed to the casing body 61, the junction box 62 is pushed into the casing body 61 from the upper opening 61a. Since the guide portions 69A and 69B of the reference locking member 65A are projected further downwardly towards the casing body 61 than those of the ordinary locking members 65B and 65C as described above, the head portion 72 of the protrusion 70A of the casing body 61 is initially inserted into the guide grooves 67A and 67B of the reference locking member 65A of the junction box 62 and thus, the junction box 62 is positioned in the longitudinal direction X and the lateral direction Y without play.

When the junction box 62 is further pushed into the casing body 61, the head portions 72 of the protrusions 70B and 70C of the casing body 61 are inserted into the guide grooves 67A and 67B of the ordinary locking members 65B and 65C of the junction box 62, respectively. Since the clearances C2 and C3 of the guide grooves 67A and 67B of the reference locking member 65A relative to the protrusion 70A in the longitudinal direction X and the lateral direction Y are set to be smaller than the clearances C2' and C3' of the guide grooves 67A and 67B of the ordinary locking members 65B and 65C relative to the protrusions 70B and 70C as described above, the head portions 72 of the protrusions 70B and 70C of the casing body 61 can be inserted into the guide grooves 67A and 67B of the ordinary locking members 65B and 65C of the junction box 62, respectively more smoothly than that of the protrusion 70A.

Namely, since the casing body 61 is a large resinous molded item, positioning of the protrusions 70A to 70C is limited by warpage of the casing body 61, contraction of the casing body 61 during its molding, etc. However, if the clearances C2 and C2' of the guide grooves 67A and 67B of the locking members 65A to 65C relative to the protrusions 70A to 70C in the longitudinal direction X and the clearances C3 and C3' of the guide grooves 67A and 67B of the locking members 65A to 65C relative to the protrusions 70A to 70C in the lateral direction Y are set as described above, positioning errors of the protrusions 70A to 70C can be absorbed to some extent by the clearances C2' and C3' of the guide grooves 67A and 67B of the ordinary locking members 65B and 65C relative to the protrusions 70B and 70C, which are larger than the clearances C2 and C3 of the guide grooves 67A and 67B of the reference locking member 65A relative to the protrusion 70A, respectively. As a result, the junction box 62 can be smoothly mounted on the casing body 61.

Subsequently, when the junction box 62 is further pushed into the casing body 61, the locking piece 66 of each of the locking members 65A to 65C of the junction box 62 is brought contact with the head portion 72 of each of the protrusions 70A to 70C of the casing body 61 in response to insertion of the head portion 72 of each of the protrusions 70A to 70C into the guide grooves 67A and 67B of each of the locking members 65A to 65C so as to be elastically deflected. Thus, the locking projection 68 is fitted into each of the locking grooves 73A to 73C of the protrusions 70A to 70C. As a result, since the locking members 65A to 65C of the junction box 62 are brought into engagement with the locking grooves 73A to 73C of the casing body 61, respectively, the junction box 62 is fixed to the casing body 61.

At this time, the elastic member 80 secured to the upper face 79 of each of the base portions 78A to 78C is depressed by a lower face 64e of the housing 64 of the junction box 62 so as to be compressed downwardly through a distance of the vertical clearance C. Accordingly, the housing 64 of the junction box 62 is elastically urged upwardly by the compressed elastic member 80 such that the upper face 68a of the locking projection 68 is pressed against the upper end 75 of each of the locking grooves 73A to 73C. Therefore, in this embodiment, the clearance C1 in the locking grooves 65A to 65C in FIGS. 8 and 9 is absorbed by the elastic member 80 and thus, vertical play between each of the locking members 65A to 65C of the junction box 62 and each of the locking grooves 73A to 73C of the casing body 61 is eliminated.

Thereafter, the locking members 84A and 84B of the relay box 63 are, respectively, brought into engagement with the locking grooves 85A and 85B of the junction box 62 fixed in the casing body 61. At this time, since a lower face 83b of the housing 83 of the relay box 63 is also elastically urged upwardly by the elastic member 80 secured to the base portion 78D in the same manner as the junction box 62, play between each of the locking members 84A and 84B and each of the locking grooves 85A and 85B is eliminated.

In the casing K2 of the present invention, the junction box 62 can be easily fixed to the casing body 61 without the need for using tools such as an impact wrench by merely bringing the locking members 65A to 65C of the junction box 62 into engagement with the locking grooves 73A to 73C of the casing body 61, respectively.

Meanwhile, since the guide portions 69A and 69B of the reference locking member 65A of the junction box 62 are projected further downwardly towards the casing body 61 than those of the ordinary locking members 65B and 65C, the head portion 72 of the protrusion 70A of the casing body 61 is initially inserted into the guide grooves 67A and 67B of the reference locking member 65A of the junction box 62 and then, the head portions 72 of the protrusions 70B and 70C of the casing body 61 are inserted into the guide grooves 67A and 67B of the ordinary locking members 65B and 65C of the junction box 62, respectively. Furthermore, since the clearances C2 and C3 of the guide grooves 67A and 67B of the reference locking member 65A relative to the protrusion 70A in the longitudinal direction X and the lateral direction Y are set to be smaller than the clearances C2' and C3' of the guide grooves 67A and 67B of the ordinary locking members 65B and 65C relative to the protrusions 70B and 70C, the junction box 62 can be smoothly fixed to the casing body 61 even when positioning errors of the protrusions 70A to 70C are produced by warpage of the casing body 61, contraction of the casing body 61 during its molding, etc. Moreover, since the elastic members 80 absorb the vertical clearance C1 of the locking members 65A to 65C of the junction box 62, vertical play of the junction box 62 in the casing body 61 is eliminated, so that such problems due to vibrations of the junction box 62 can be prevented that noises are produced, function of components, e.g., relays in the junction box 62 deteriorates and heat is produced at contact portions between the junction box 62 and the casing body 61.

In addition, the protrusions 70A to 70C provided on the casing body 61 can be molded integrally with the casing body 61 at the time of resinous molding of the casing body 61, while the locking members 65A to 65C provided on the housing 64 of the junction box 62 can be molded integrally with the housing 64 of the junction box 62 at the time of resinous molding of the housing 64 of the junction box 62. Therefore, since such components as bolts 22A and 22B and nuts 24A and 24B employed in a prior art casing shown in FIG. 2 are not required to be provided additionally, cost for these bolts and nuts and operational cost for fastening the bolts to the casing body become unnecessary, thereby resulting in reduction of production cost of the casing.

Furthermore, since mounting portions 23a each having a through-hole 23b used in a junction box 23 for the prior art casing of FIG. 2 are not required to be provided on the junction box 62 but only the locking members 65A to 65C may be provided on the side faces 64a to 64c of the housing 64 of the junction box 62, degree of freedom for laying bus bars in the junction box 62 is raised and the number of components mounted on the junction box 62 can be increased.

Meanwhile, the present invention is not restricted to the above described second embodiment but can be modified variously. For example, in the second embodiment, the locking members 65A to 65C are provided on the housing 64 of the junction box 62 and the locking grooves 73A to 73C are provided on the casing body 61. On the contrary, the locking members may also be provided on the casing body 61 by providing the locking grooves on the housing 64 of the junction box 62. Meanwhile, the locking mechanism for securing the junction box 62 to the casing body 61 is not restricted to the locking members 65A to 65C and the locking grooves 73A to 73C but may be of any construction.

Furthermore, in the second embodiment, the junction box 62 is fixed to the casing body 61. However, the second embodiment is not restricted to fixing of the junction box 62 to the casing body 61 but may also be applicable to fixing of other electrical connection boxes such as a relay box and a fusible link box to the casing body 61.

As will be seen from the foregoing description, the following effects can be achieved in the casing K2 of the present invention. Firstly, since the electrical connection box can be fixed to the casing through mere engagement of the locking members of the electrical connection box with the locking grooves of the casing body, the electrical connection box can be easily fixed to the casing without the need for using tools such as an impact wrench.

Meanwhile, since the locking members and the protrusions can be formed integrally with the housing of the electrical connection box and the casing body, components such as bolts and nuts for fixing the electrical connection box to the casing body are not required to be provided additionally, so that cost for the bolts and the nuts and operational cost for fastening the bolts to the casing body are obviated, thereby resulting in reduction of production cost of the casing.

Furthermore, since the mounting portions having the through-holes used in the electrical connection box for the prior art casing are not required to be provided in the electrical connection box, degree of freedom for laying bus bars in the electrical connection box is raised and the number of components mounted on the electrical connection box can be increased.

Moreover, since the guide portions of the reference locking member are projected further downwardly towards the casing body than those of the ordinary locking members, the protrusion corresponding to the reference locking member is inserted into the guide grooves of the reference locking member earlier than those corresponding to the ordinary locking members are inserted into the guide grooves of the ordinary locking members, the electrical connection box can be rapidly positioned relative to the casing body.

In addition, since the longitudinal and lateral clearances of the guide grooves of the reference locking member relative to the corresponding protrusion are set to such minimum values as to enable fitting of the corresponding protrusion into the guide grooves of the reference locking member to be smaller than those of the ordinary locking members, the electrical connection box is positioned relative to the casing body without play, while positional errors of the casing body due to warpage of the casing body, etc. can be absorbed by the ordinary locking members.

What is claimed is:

1. A casing for receiving a plurality of electrical connection boxes, comprising:
    a casing body for accommodating at least one of the electrical connection boxes therein;
    a cover for closing an opening of the casing body; and
    an outer fixing member for fixing the remaining one of the electrical connection boxes to an outside of the casing body, which is provided on the outside of the casing body.

2. A casing as claimed in claim 1, wherein the outer fixing member includes a through-hole for receiving the remaining one of the electrical connection boxes and an engageable plate projecting into the through-hole so as to fix the remaining one of the electrical connection boxes to the outside of the casing body through engagement of a locking arm of the remaining one of the electrical connection boxes with the engageable plate.

3. A casing as claimed in claim 1, wherein the cover includes a protective portion for covering an upper portion of the remaining one of the electrical connection boxes when the remaining one of the electrical connection boxes is fixed to the outside of the casing body by the outer fixing member.

4. A casing as claimed in claim 2, wherein the cover includes a protective portion for covering an upper portion of the remaining one of the electrical connection boxes when the remaining one of the electrical connection boxes is fixed to the outside of the casing body by the outer fixing member.

5. A casing as claimed in claim 1, wherein the remaining one of the electrical connection boxes is a fusible link box.

6. A casing as claimed in claim 2, wherein the remaining one of the electrical connection boxes is a fusible link box.

7. A casing as claimed in claim 3, wherein the remaining one of the electrical connection boxes is a fusible link box.

8. A casing as claimed in claim 4, wherein the remaining one of the electrical connection boxes is a fusible link box.

9. A construction for fixing an electrical connection box in a casing body of a casing, comprising:

a plurality of locking members which are provided on side faces of a housing of the electrical connection box, respectively and each of which includes a locking piece and a guide portion having a guide groove; and a plurality of protrusions which are, respectively, provided on inner faces of side walls of the casing body so as to be each inserted into the guide groove and each of which includes a locking groove engageable with the locking piece;

wherein one of the locking members acts as a reference locking member such that the guide portion of the reference locking member is projected further towards the casing body than those of the remaining ones of the locking members.

10. A construction as claimed in claim 9, wherein longitudinal and lateral clearances of the guide groove of the reference locking member relative to a corresponding one of the protrusions are set to such minimum values as to enable fitting of the corresponding one of the protrusions into the guide groove of the reference locking member to be smaller than those of the guide grooves of the remaining ones of the locking members relative to the remaining ones of the protrusions.

* * * * *